(12) United States Patent
Mathew et al.

(10) Patent No.: US 7,382,132 B1
(45) Date of Patent: Jun. 3, 2008

(54) 6-CHANNEL ARRAY COIL FOR MAGNETIC RESONANCE IMAGING

(75) Inventors: Susan Mathew, College Station, TX (US); Eddy Benjamin Boskamp, Menomonee Falls, WI (US); Leroy Blawat, Milwaukee, WI (US); John E Lorbiecki, Hubertus, WI (US); Bernice E Hoppel, Delafield, WI (US)

(73) Assignees: General Electric Company, Schenectady, NY (US); The Texas A&M University System, A Texas State Agency, College Station, TX (US)

( * ) Notice: Subject to any disclaimer, the term of this patent is extended or adjusted under 35 U.S.C. 154(b) by 55 days.

(21) Appl. No.: 10/908,176

(22) Filed: Apr. 29, 2005

(51) Int. Cl.
*G01V 3/00* (2006.01)

(52) U.S. Cl. .................................. 324/318

(58) Field of Classification Search ......... 324/300–322
See application file for complete search history.

(56) References Cited

U.S. PATENT DOCUMENTS

| | | | | |
|---|---|---|---|---|
| 4,825,162 | A * | 4/1989 | Roemer et al. ............. 324/318 |
| 5,489,847 | A * | 2/1996 | Nabeshima et al. ........ 324/318 |
| 5,578,925 | A * | 11/1996 | Molyneaux et al. ........ 324/318 |
| 5,757,189 | A * | 5/1998 | Molyneaux et al. ........ 324/318 |
| 5,905,378 | A * | 5/1999 | Giaquinto et al. .......... 324/318 |
| 6,084,411 | A * | 7/2000 | Giaquinto et al. .......... 324/318 |
| 6,246,898 | B1 * | 6/2001 | Vesely et al. ............... 600/424 |
| 6,289,232 | B1 * | 9/2001 | Jakob et al. ................ 600/410 |
| 6,441,615 | B1 * | 8/2002 | Fujita et al. ................ 324/318 |
| 6,534,983 | B1 * | 3/2003 | Boskamp et al. ........... 324/318 |
| 6,577,888 | B1 * | 6/2003 | Chan et al. ................. 600/422 |
| 6,650,926 | B1 * | 11/2003 | Chan et al. ................. 600/422 |
| 6,747,454 | B2 * | 6/2004 | Belt ........................... 324/318 |
| 6,784,665 | B1 * | 8/2004 | Chan et al. ................. 324/318 |
| 6,845,260 | B2 * | 1/2005 | Liu et al. .................... 600/410 |
| 6,876,201 | B2 * | 4/2005 | Takizawa et al. ........... 324/318 |
| 6,906,518 | B2 * | 6/2005 | Leussler .................... 324/318 |
| 2005/0107686 | A1 * | 5/2005 | Chan et al. ................. 600/422 |

OTHER PUBLICATIONS

Mathew, S. et al., "Optimization of Carotid Coils", ISMRM Twelfth Scientific Meeting & Exhibition, 2004, p. 1550.

* cited by examiner

*Primary Examiner*—Brij B. Shrivastav
*Assistant Examiner*—Dixomara Vargas
(74) *Attorney, Agent, or Firm*—Ziolkowski Patent Solutions Group, SC

(57) ABSTRACT

A method and apparatus for acquiring high resolution MR images of a carotid artery. A six-channel RF coil array has three RF coils placed in an overlapping pattern and positioned adjacent to a first region-of-interest (ROI) of an imaging patient. The six-channel RF coil also has three RF coils placed in an overlapping pattern and positioned adjacent to a second ROI of an imaging patient.

30 Claims, 7 Drawing Sheets

Slice 1    Slice 2    Slice 3

6-CHANNEL ARRAY COIL FOR MAGNETIC RESONANCE IMAGING

GOVERNMENT LICENSE RIGHTS

The U.S. Government has a paid-up license in this invention and the right in limited circumstances to require the patent owner to license others on reasonable terms as provided for by the terms of Grant No. BES-0101059 awarded by the National Science Foundation.

BACKGROUND OF THE INVENTION

The present invention relates generally to magnetic resonance (MR) imaging and, more particularly, to an apparatus to acquire high resolution MR images at a site of carotid artery bifurcation. The invention is further directed to an imaging coil, applicable with different patient sizes and contours, capable of acquiring MR data with sufficient penetration to capture contrast of a plaque formed of a thin fibrous membrane covering a large lipid. The present invention may therefore be advantageously implemented in the detection of carotid atherosclerosis—a leading cause of acute stroke.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Noninvasive imaging of carotid artery bifurcation, which is prone to plaque formation due to turbulent blood flow, is of great neurological interest, since carotid atherosclerosis is a leading cause of acute stroke. The vulnerable plaque is typically formed from a thin fibrous membrane of less than 65 µm, covering a large, possibly necrotic, lipid core. A necrotic core of the plaque can be on the order of 1 mm². A rupture of this thin fibrous cap can expose the thrombogenic lipid core of the atheroma to flowing blood, exposing a patient to a risk of thrombosis.

For accurate determination of vulnerable atheromas, extremely high spatial resolution is required to measure the necrotic core, thrombolytic element, and possibly the thickness of the fibrous membrane. Detecting plaque inflammation due to macrophage infiltration may also provide important information in the diagnosis and treatment of vulnerable plaques. Since plaque components have sub-millimeter dimensions, MR images with high spatial resolution and sufficient signal-to-noise ratio (SNR) at the site of carotid artery bifurcation, which, on average, is 3.5 cm away from the surface of human neck, are required to characterize the vulnerable plaque to determine the probability of rupture. A resolution of about 50-300 µm in-plane is desirable in most cases.

Conventional approaches for local imaging have included using relatively small local coils. Small local coils are known to produce high resolution images with good SNR; however, signal penetration of known small coils is generally not sufficient to provide high resolution images at the site of carotid artery bifurcation.

Furthermore, the site of carotid artery bifurcation varies across patient populations. For example, the location of the carotid artery bifurcation may be closer to the head of one patient and closer to the base of the neck in another patient. Moreover, to increase patient throughput, a large field-of-view (FOV) in the superior—inferior (SI) direction is necessary to ensure capturing the carotid artery bifurcation within the FOV during imaging. Known local imaging coils lack the patient-to-patient variability desired for carotid artery bifurcation imaging. Moreover, these known local imaging coils do not provide the desired balance between SNR and penetration desired for carotid artery bifurcation imaging. Furthermore, in producing maps of the regions, which can be used for sizing and characterization of the local lesions, it is important to produce little fall off in the regions of interest. Smaller coils can produce depth fall off of CNR (contrast to noise ratio) as well as SNR (signal to noise ratio). This can lead to parametric deviations such as seen in T2 and T2* differences in images, which can produce misleading results about the stratification of the plaques. Additionally, a large enough field of view in the SI direction is required due to possible surgical planning which may occur from the images. Surgical planning requires obtaining certain anatomical landmarks in the images relative to the plaques (i.e. location of certain nerves and spine processes before a carotid endarterectomy).

It would therefore be desirable to have an apparatus for acquiring MR data with a high spatial resolution and an SNR at the site of carotid artery bifurcation that is applicable with subjects of varying sizes.

BRIEF DESCRIPTION OF THE INVENTION

The present invention provides an apparatus for carotid artery bifurcation imaging that overcomes the aforementioned drawbacks. The system includes a six-channel RF coil assembly that provides high resolution and SNR at the site of carotid artery bifurcation for enhanced detection of atheromas and plaques. Further, the coil assembly is constructed to be applicable across a relatively large patient population.

The six-channel coil assembly, which in a preferred embodiment comprises two sets of three overlapping coils, acquires images with high spatial resolution and desired penetration without sacrificing SNR. The coil assembly also includes an anatomically shaped coil former that fits snuggly and comfortably to a patient's neck. Not only is the coil assembly constructed to be applicable with various patient sizes and contours, but the assembly also provides large SI directional coverage. Additionally, the coil assembly may be used to acquire MR data in accordance with a number of scan protocols including, but not limited to black-blood imaging, parametric mapping techniques, parallel imaging, and time-of-flight (TOF) MR angiography (MRA).

Therefore, in accordance with one aspect of the invention, a magnetic resonance (MR) coil apparatus includes a first coil array having three coils placed in an overlapping pattern and configured to be positioned adjacent to an imaging patient such that a first region-of-interest (ROI) of the imaging patient is within a field-of-view (FOV) of the first coil array. The MR coil apparatus also includes a second coil array having three coils placed in an overlapping pattern and configured to be positioned adjacent to the imaging patient such that a second ROI of the imaging patient is within an FOV of the second coil array.

In accordance with another aspect of the invention, an MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The RF coil assembly has a first former having three RF coils attached thereto and positionable adjacent to a first head portion and a first neck portion of a patient and a second former having three RF coils attached thereto and positionable adjacent to a second head portion and a second neck portion of the patient.

In accordance with yet another aspect of the invention, a method of manufacturing an RF coil assembly includes the steps of attaching a first set of three RF coils to a first former and attaching a second set of three RF coils to a second former. The method also includes the steps of attaching a first adjustable support to the first former and attaching a second adjustable support to the second former. The method further includes the steps of connecting a first cable routed through the first adjustable support to each RF coil of the first set of RF coils and connecting a second cable routed through the second adjustable support to each RF coil of the second set of RF coils.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
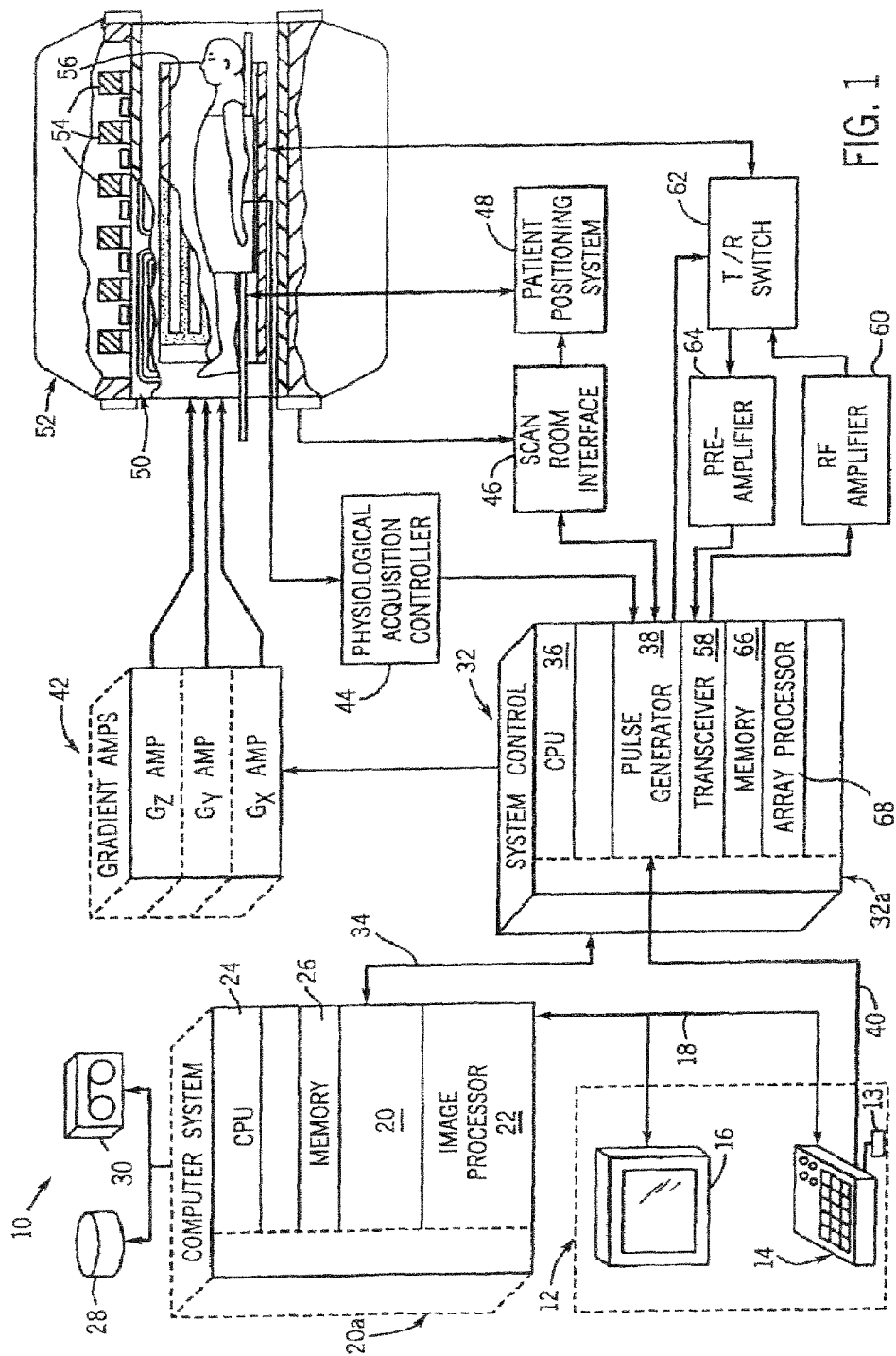
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 or separate RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to an RF coil array that may be carried out with the MR imaging system illustrated in FIG. 1, or equivalent thereof. When using the RF coil of the present invention in conjunction with the MR imaging system illustrated in FIG. 1, MR images can be reconstructed showing better than 200 μm resolution with a sufficient SNR at the site of carotid artery bifurcation. The RF coil array can be used with MR systems configured to impress a 1.5T or a 3.0T polarizing magnetic field. The RF coil array may also be used for parallel imaging.

Figure 2:
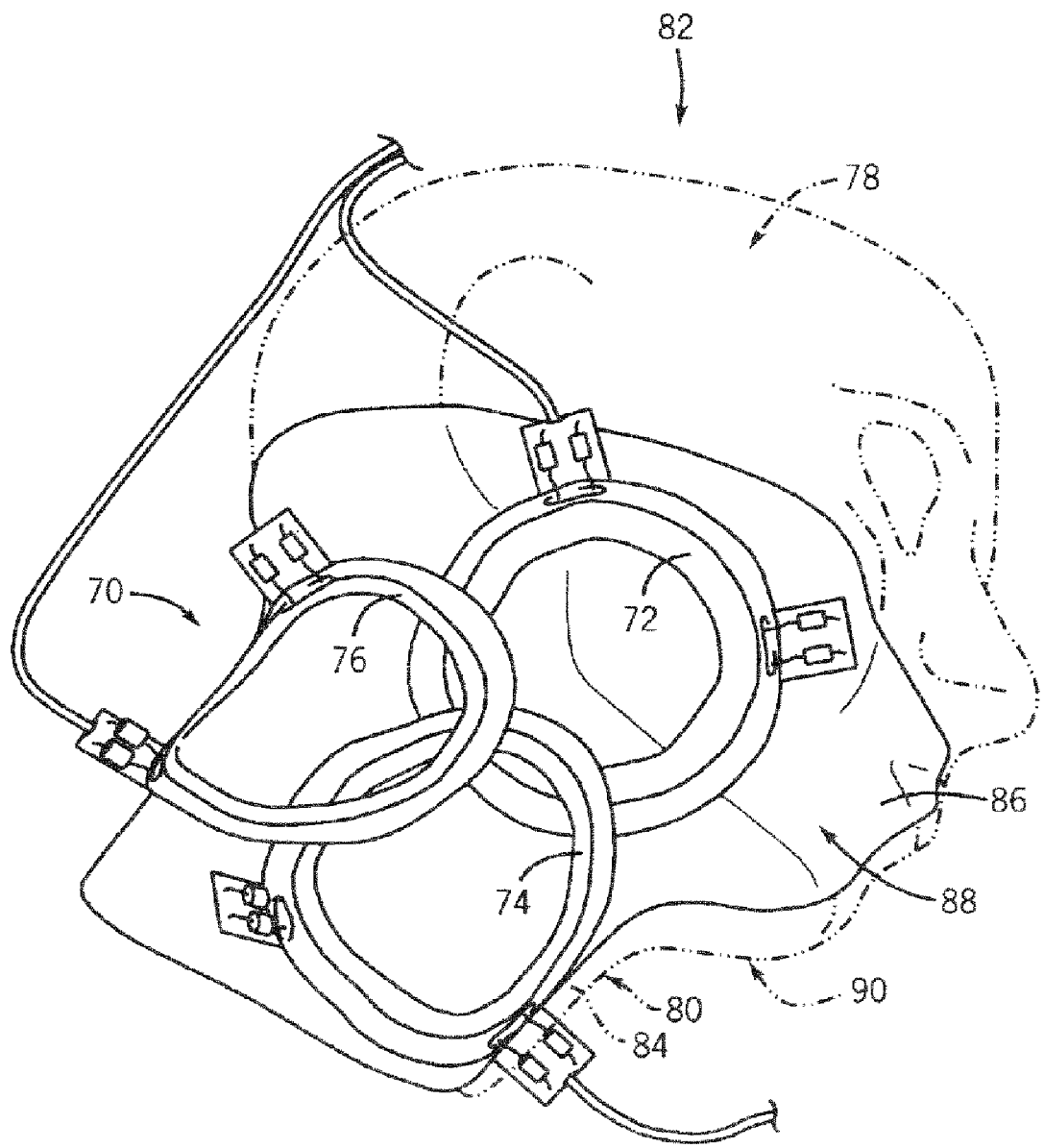
FIG. 2 is a perspective view of three coils of a coil array according to one embodiment of the present invention.

Referring now to FIG. 2, three RF coils of one half of a six-channel RF coil array 70 are shown overlaid on a head and neck region of a subject (shown in phantom) according to one embodiment of the present invention. In a preferred embodiment, a first RF coil 72, a second RF coil 74, and a third RF coil 76 are positioned adjacent to a head 78 and a neck 80 of an imaging patient 82. Alternatively, the first RF coil 72, the second RF coil 74, and the third RF coil 76 may be used in other regions of the body, such as legs, arms and shoulder regions. In this manner, high resolution images may be acquired, for example, of vasculature, cartilage, or ligament/tendon regions and the like. Furthermore, the first and second coil arrays may be used to acquire real-time data for intracorporeal device tracking or for assisting surgeons during surgical procedures.

Each RF coil 72-76 is a circular loop that, in a preferred embodiment, has a diameter of approximately three inches such that an increased SNR at a depth of approximately 3.5 cm from a surface 84 of the neck 80 is realized. One skilled in the art will appreciate that other loop diameters are contemplated. RF coils 72-76 are positioned in a generally triangular-shaped overlapping arrangement to isolate one RF coil 72-76 from another. In this regard, isolation between the RF coils 72-76 is less than −20 dB.

RF coils 72-76 are fastened to a right-side former 86 having a surface contoured to substantially match a portion of the head 78 and neck 80. The right-side former 86, contoured in this manner, assists in signal penetration toward the carotid artery and toward the site of the carotid artery bifurcation. The right-side former 86 is positioned next to the head 78 and neck 80 of imaging patient 82 during imaging and is removed when scanning is complete. The right-side former 86 assists in placing the RF coils 72-76 in position for imaging the carotid artery bifurcation and helps reduce damage to the RF coils 72-76. The right-side former 86 also provides a contoured guide for the imaging patient 82 to use to maintain a steady position of the head 78 and neck 80 during imaging.

As shown in FIG. 2, one half of the six-channel RF coil array 70 is positioned next to the right side 88 of the head 78 and neck 80 of the imaging patient 82. A second half (not shown) of the six-channel RF coil array 70 mirrors the first half of the six-channel RF coil array 70 and is positioned next to the left side 90 of the head 78 and neck 80 of the imaging patient during imaging. In a typical scan, the imaging patient 82 lies down in a supine position. Then, each half of the six-channel RF coil array 70 is positioned adjacent to the patient's head 78 and neck 74. After imaging, each half of the six-channel RF coil array 70 is removed and stored.

Figure 3:
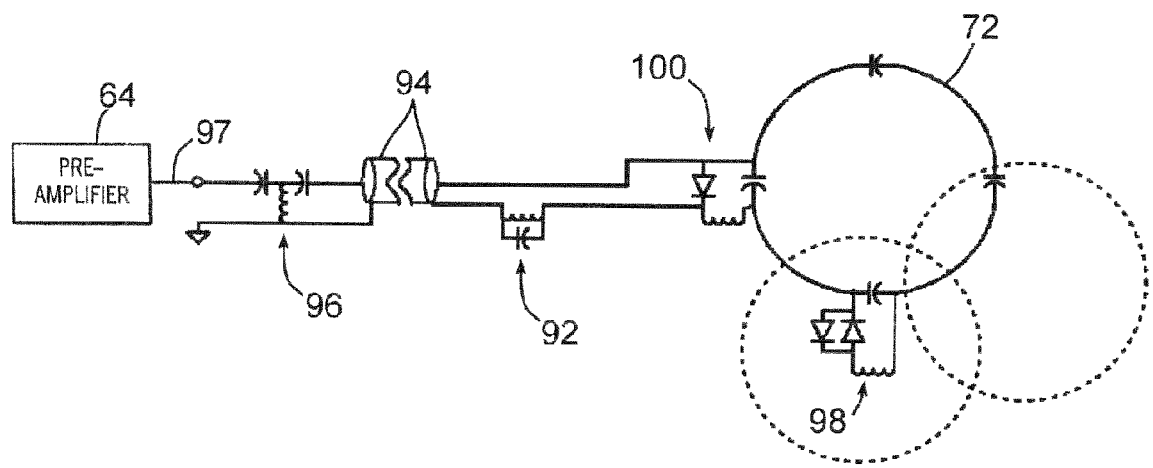
FIG. 3 is a schematic diagram of one of the coils of the coil array of FIG. 2.

FIG. 3 illustrates a schematic diagram of an RF coil 72 in accordance with the present invention. While FIG. 3 shows the schematic diagram of a single RF coil 72, one skilled in the art will appreciate that each RF coil in the six-channel RF coil array 70 may be similarly constructed. RF coil 72 is connected via a balun 92 to a half-wavelength cable 94. Half-wavelength cable 94 is further connected via a balun 96 to an independent receive channel 97 of a preamplifier 64, which has a low input resistance, to reduce interaction between RF coil 72 and other surface coils not immediately adjacent thereto. Accordingly any combination of coils 72-76 may be used for data acquisition. In a preferred embodiment, baluns 92 and 96 are cable trap baluns. A passive decoupling circuit 98 is connected to RF coil 72 and an active decoupling circuit 100 is placed between RF coil 72 and balun 92 to detune RF coil 72 from RF transmission from RF coil 56 of FIG. 1 during the transmit mode. RF coil 72 is preferably tuned and matched to 50 ohms at 63.86 MHz and 127.74 MHz for 1.5 T and 3.0T, respectively. RF coils 74 and 76 are shown in phantom to illustrate the overlapped arrangement of RF coils 72-76.

Figure 4:
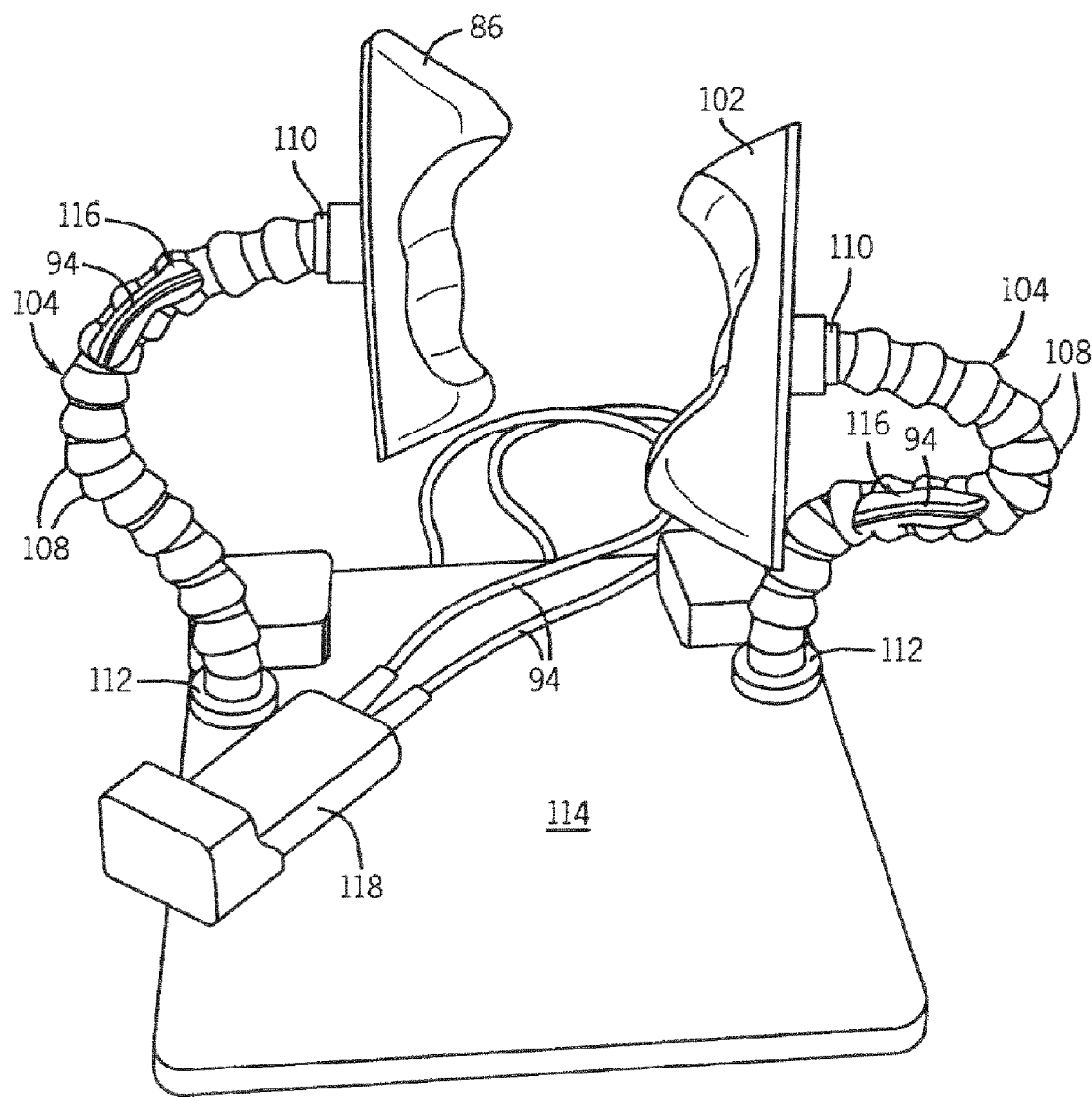
FIG. 4 is a perspective view of a coil array according to one embodiment of the present invention.

FIG. 4 shows the six-channel RF coil array 70 mounted to right-side former 86 and a left-side former 102. The right-side former 86 and the left-side former 102 are attached to a pair of pliable positioning devices 104. In a preferred embodiment, each pliable positioning device 104 is a ball-and-socket tube formed from a plurality of ball-and-socket connectors 108 coupled end-to-end. A terminating connector 110 is attached to one end of each pliable positioning device 104 to attach a respective former 78, 102 thereto. Another terminating connector 112 is attached at an opposite end of each pliable positioning device 104 to attach the pliable positioning device 104 to a support surface 114. In a preferred embodiment, support surface 114 is a stand-alone base that is placed under the imaging patient 82 during imaging. Alternatively, support surface 114 is a patient table positionable within RF coil 56.

Right-side former 86 is positionable on the right side 88 of a patient's head 78 and neck 80 and left-side former 102 is positionable on the left side 90 of a patient's head 78 and neck 80. Each former 86, 102 has three RF coils attached thereto as described above. The half-wavelength cables 94 attached to each RF coil pass through a center passage 116 of the pliable positioning device 104 to a connector 118 engageable with the MRI system 10.

Three coils on each side of the head 78 and neck 80 enables coverage between 16 cm and 20 cm FOVs both superior and inferior to the bifurcation, which reduces the need to reposition the six-channel RF coil array 70 for a patient. In this regard, the six-channel RF coil array 70 easily accommodates different patient sizes and shapes. The pair of pliable positioning devices 104 also allows positioning of the formers 86, 102 adjacent to a variety of head 78 and neck 80 sizes. Furthermore, the placement of the formers 86, 102 is such that parallel imaging can be used to decrease imaging time in both the in-plane and through-plane directions, allowing for greater resolution in a relatively short imaging time.

It is contemplated that each RF coil may be connected to its own receive channel. In this manner, a multiple-channel MRI system may be configured to use each RF coil during data acquisition or to use less than all of the RF coils during data acquisition. It is also contemplated that the RF coils may be used with quadrature detection or linear detection.

Figure 5:
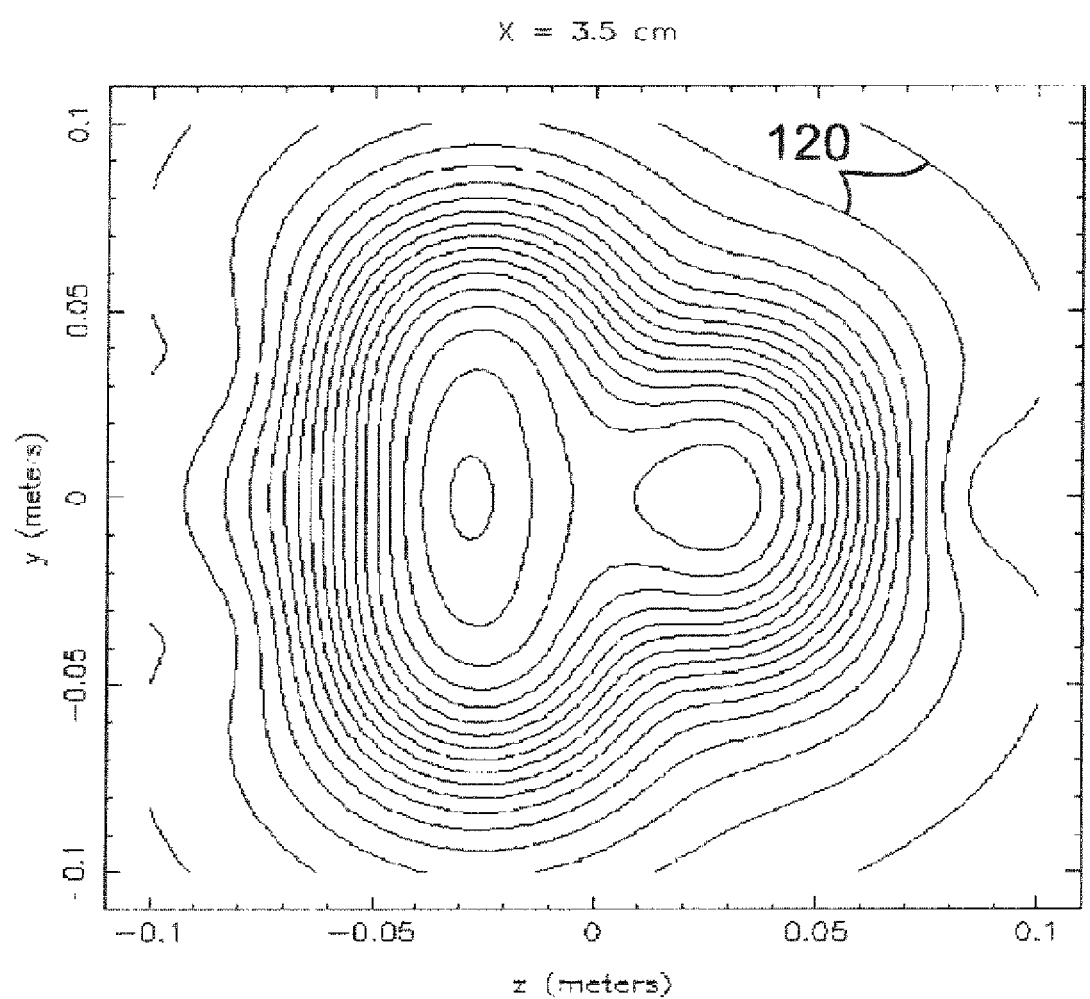
FIG. 5 is an isocontour plot of $B_1$ amplitude in a plane parallel to the coil of FIG. 2 at a depth of 3.5 cm.

FIG. 5 shows contours 120 in an isocontour plot of $B_1$ amplitude in a plane parallel to the RF coils 72-76 of FIG. 2. The plane is at a depth of 3.5 mm from the RF coils 72-76. The stepsize of the contours 120 is 0.5 dB. FIG. 5 also shows the homogeneity of the six-channel RF coil array 70.

Figure 6:
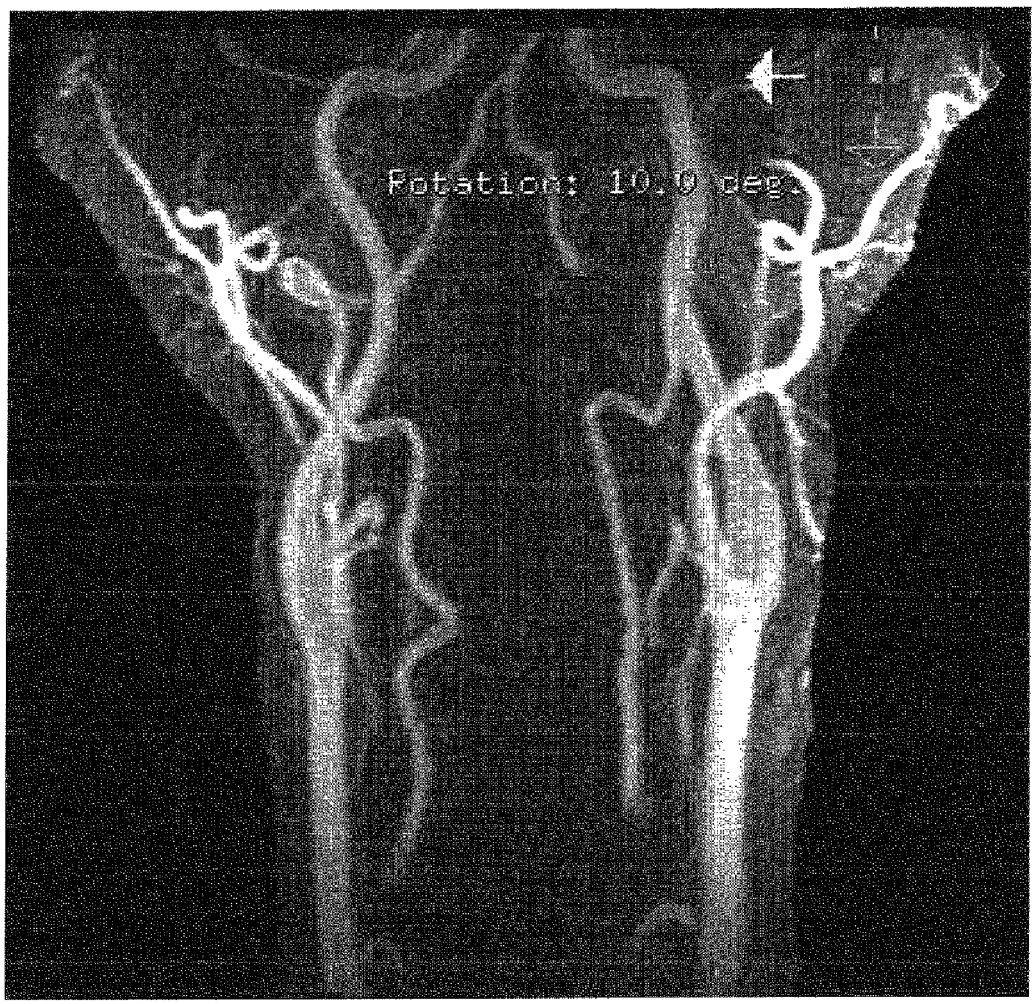
FIG. 6 is a contrast enhanced MR image showing a pair of carotid arteries of an imaging patient.
Figure 7:
FIG. 7 is an image showing three high resolution slice images of a carotid artery.
Figure 8:
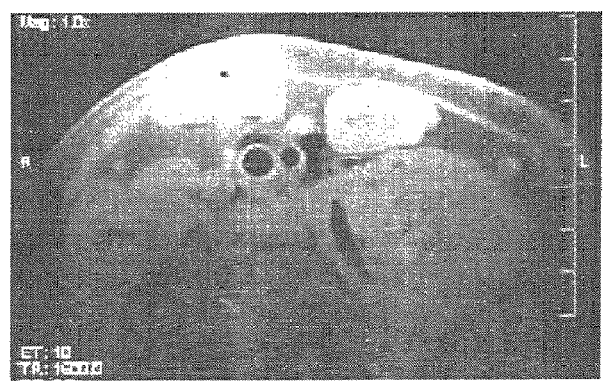
FIG. 8 is a proton density weighted image showing a carotid artery superior to bifurcation.

FIGS. 6-8 are images acquired by the six-channel RF coil array 70 of FIG. 4 from volunteers under test conditions. The images of FIGS. 6 and 7 were acquired on a GE Healthcare Signa® Excites 3.0T Whole Body Scanner (Waukesha Wis., USA) having a FOV of 8×4 $cm^2$, centered on carotid artery, with a matrix size of 512×256, resulting in an in-plane resolution of 156×156 $\mu m^2$ with a slice thickness=4 mm, 16ETL, and 4NEX. Signa® and Excite® are registered trademarks of General Electric Company of Schenectady, N.Y. FIG. 6 was acquired using a contrast enhanced time-of-flight (TOF) vascular technique. The homogeneity and SNR is shown in a 12 cm through-plane surrounding the carotid artery bifurcation. FIG. 7 shows three high resolution slice images of a carotid artery acquired using an inner volume black-blood technique. FIG. 8 shows a proton density image illustrating signal penetration at the level of a carotid artery superior to bifurcation.

In a preferred embodiment, the present invention is directed a six-channel RF coil assembly that includes two sets of RF coils independently positionable adjacent to the head and neck of an imaging patient. The six-channel RF coil assembly includes two formers, each former is attached to pliable positioning devices and has three RF coil loops having a diameter of approximately three inches attached thereto. High resolution MR images with desired penetration of the carotid artery of the imaging patient may be acquired using the six-channel RF coil assembly. In this regard, the present invention may assist health care professionals in visualizing and characterizing a number of medical conditions, such as atherosclerotic plaques.

Additionally, the present invention is applicable with a number of scan protocols, such as black-blood carotid artery MR imaging. As one skilled in the art will appreciate, due to aliasing artifacts, the FOV for high-resolution black-blood carotid artery imaging along the phase-encoding direction must, in general, be larger than the total anatomy size in the phase-encoding direction. As a result, an inherent inefficiency is introduced in spatial resolution and scan time that is particularly prevalent when imaging only one of the left or right carotid artery. In this regard, the present invention may be used in conjunction with a double-inversion, fast spin echo (DIR-FSE) imaging technique in a high field (e.g. 3T) to perform ultra high-resolution black-blood FSE carotid artery MRI to counterbalance the spatial resolution and scan time penalties typically encountered in black-blood FSE carotid artery MRI.

For example, using a six-channel RF coil assembly according to the present invention with DIR-FSE technique together with a high field 3.0T MRI system, exemplary ultra high-resolution black-blood FSE carotid artery MR images were acquired under test conditions. Data was acquired using the six-channel RF coil assembly with a 3T whole-body short-bore TwinSpeed® MR scanner with a maximum gradient strength of 40 mT/m and a maximum gradient slew rate of 150 T/m/s demonstrate the feasibility of acquiring ultra high-resolution (156 $\mu m$) black-blood images of the carotid arteries using inner volume DIR-FSE at 3T, within a reasonable scan time. TwinSpeed® is a registered trademark of General Electric Company of Schenectady, N.Y. An FOV of 8×4 $cm^2$ was used, centered on either the left carotid artery or the right carotid artery, with a k-space matrix size of 512×256, resulting in an in-plane resolution of 156×156 $\mu m^2$, with a slice thickness of 2.0 mm, a receiver bandwidth of ±62.5 kHz, an echo train length of 16, and cardiac gating with an interval of 2.0 heartbeats between slices (i.e., TR=2R-R). Effective TE=10 ms, and 8 averages was used. Double inversion pulses were carried out at an appropriate delay time before the excitation pulse in order to produce black-blood images. Depending on the heart rate, the total scan time per slice ranged from 2.5 to 4.8 min.

The resulting images showed excellent contrast of the left and right carotid arteries and at a reduced scan time relative to conventional carotid artery techniques. Moreover, the resulting images indicated that the present invention in conjunction with a tailored DIR-FSE protocol is a feasible solution to ultra high-resolution black-blood imaging of the carotid arteries. In this regard, it is believed that the present invention may be applicable in visualizing and characterizing vascular and atherosclerotic plaques. Moreover, the coil assembly may be used with gated and non-gated scan protocols as well as single and multi-slice acquisitions.

In addition to black-blood imaging, the present invention may also be applicable with TOF-MRA of the carotid artery. Generally, high resolution TOF-MRA images of the carotid artery at 1.5T suffer from poor SNR. However, testing showed the present invention may be particularly advantageous for TOF-MRA of the carotid artery at 3.0T. The resulting 3.0T images showed that the data acquired with the six-channel phase array RF coil provided a significant improvement in delineation of the carotid artery. Moreover, average SNR and standard deviations of blood signal in the carotid artery were markedly improved relative to data acquired at 1.5T. Additionally, data acquired with the six-channel coil array was compared to data acquired with a conventional four-channel neurovascular coil. The results revealed an approximate four-fold increase in SNR for the six-channel carotid coil relative to the four-channel neurovascular coil.

Therefore, in accordance with one embodiment of the invention, a magnetic resonance (MR) coil apparatus includes a first coil array having three coils placed in an overlapping pattern and configured to be positioned adjacent to an imaging patient such that a first region-of-interest (ROI) of the imaging patient is within a field-of-view (FOV) of the first coil array. The MR coil apparatus also includes a second coil array having three coils placed in an overlapping pattern and configured to be positioned adjacent to the imaging patient such that a second ROI of the imaging patient is within an FOV of the second coil array.

In accordance with another embodiment of the invention, an MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The RF coil assembly has a first former having three RF coils attached thereto and positionable adjacent to a first head portion and a first neck portion of a patient and a second former having three RF coils attached thereto and positionable adjacent to a second head portion and a second neck portion of the patient.

In accordance with yet another embodiment of the invention, a method of manufacturing an RF coil assembly includes the steps of attaching a first set of three RF coils to a first former and attaching a second set of three RF coils to a second former. The method also includes the steps of attaching a first adjustable support to the first former and attaching a second adjustable support to the second former. The method further includes the steps of connecting a first cable routed through the first adjustable support to each RF coil of the first set of RF coils and connecting a second cable routed through the second adjustable support to each RF coil of the second set of RF coils.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) coil apparatus comprising:
a first surface coil array having three circular coils overlapping one another and configured to be positioned adjacent to an imaging patient such that a first region-of-interest (ROI) of the imaging patient is within a field-of-view (FOV) of the first coil array;
a second surface coil array having three circular coils overlapping one another and configured to be positioned adjacent to the imaging patient such that a second ROI of the imaging patient is within an FOV of the second coil array;
a first former having the first coil array attached thereto;
a first pliable positioning device attached to the first former and constructed to allow positioning of the first former adjacent to the imaging patient such that the first ROI is within the FOV of the first coil array;
a second former having the second coil array attached thereto; and
a second pliable positioning device attached to the second former and constructed to allow positioning of the second former adjacent to the imaging patient such that the second ROI is within the FOV of the second coil array.

2. The MR coil apparatus of claim 1 wherein the first ROI comprises a first carotid artery, and wherein the second ROI comprises a second carotid artery.

3. The MR coil apparatus of claim 1 wherein the coils of the first coil array and the coils of the second coil array are connected to independent receive channels.

4. The MR coil apparatus of claim 1 configured to be used with at least one of a quadrature detection and a linear detection.

5. The MR coil apparatus of claim 1 configured to provide real-time data for tracking of intracorporeal devices.

6. The MR coil apparatus of claim 1 wherein the first coil array and the second coil array are arranged symmetrically relative to one another.

7. The MR coil apparatus of claim 1 wherein the coils of the first coil array are constructed such that less than all the coils may be used for data acquisition, and wherein the coils of the second coil array are constructed such that less than all the coils may be used for data acquisition.

8. The MR coil apparatus of claim 1 wherein the overlapping pattern of the three coils of the first coil array is generally triangular-shaped and configured to maximize coil isolation between the three coils of the first coil array, and wherein the overlapping pattern of the three coils of the second coil array is generally triangular-shaped and configured to maximize coil isolation between the three coils of the second coil array.

9. The MR coil apparatus of claim 1 wherein each of the three coils of the first coil array and each of the three coils of the second coil array has a diameter of approximately three inches.

10. The MR coil apparatus of claim 1 further comprising at least one passive decoupling circuit attached to each coil of the first and second coil arrays to decouple each coil of the first and second coil arrays from an RF transmit coil during RF transmission.

11. The MR coil apparatus of claim 1
wherein the first former is constructed to have a surface portion contoured to substantially match at least a first portion of a head and at least a first portion of a neck of the imaging patient; and
wherein the second former is constructed to have a surface portion contoured to substantially match at least a second portion of the head and at least a second portion of the neck of the imaging patient.

12. The MR coil apparatus of claim 1 wherein at least one of the first and second pliable positioning devices is further defined as a ball-and-socket tube constructed to maintain a desired position of the former attached thereto.

13. The MR coil apparatus of claim 1 wherein the first and second pliable positioning devices are configured to be secured to a table of an MR scanner.

14. The MR coil apparatus of claim 1 configured for one of gated cardiac imaging and parametric imaging.

15. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images, the RF coil assembly comprising:
a first former having three RF coils attached thereto and positionable adjacent to a first head portion and a first neck portion of a patient;
a second former having three RF coils attached thereto and positionable adjacent to a second head portion and a second neck portion of the patient; and
wherein the three RF coils attached to the first former are positioned in an overlapped arrangement such that isolation between the coils is less than −20 decibels and wherein the three RF coils attached to the second former are positioned in an overlapped arrangement such that isolation between the coils is less than −20 decibels.

16. The method of claim 15 wherein each RF coil has a cable trap balun connected thereto, and wherein the cable trap balun is further connected to a half-wavelength cable.

17. The MRI apparatus of claim 15 wherein each RF coil has at least one active decoupling circuit and at least one passive decoupling circuit attached thereto configured to detune the RF coil during an RF transmit pulse.

18. The method of claim 15 wherein the first former and the second former are sized to accommodate a plurality of head and neck sizes.

19. The MRI apparatus of claim 15 wherein each RF coil has a diameter of approximately three inches.

20. The MRI apparatus of claim 15 wherein the MRI system is configured to impress at least one of a 1.5T and a 3.0T polarizing magnetic field.

21. A method of manufacturing an RF coil assembly comprising the steps of:
attaching a first set of three RF coils to a first former;
attaching a second set of three RF coils to a second former;
attaching a first adjustable support to the first former;
attaching a second adjustable support to the second former;

connecting a first plurality of wires routed through the first adjustable support to each RF coil of the first set of RF coils; and connecting a second plurality of wires routed through the second adjustable support to each RF coil of the second set of RF coils.

22. The method of claim 21 further comprising the steps of:

shaping the surface of the first former to substantially conform to at least a first portion of a head and at least a first portion of a neck of an imaging patient; and shaping the surface of the second former to substantially conform to at least a second portion of a head and at least a second portion of a neck of an imaging patient.

23. The method of claim 21 further comprising the step of attaching the first and second adjustable supports to one of a patient positioning table and a housing configured to be positioned underneath an imaging patient.

24. The method of claim 21 further comprising the steps of:

forming each RF coil of the first set of three RF coils into circular loops having a diameter of approximately three inches; and forming each RF coil of the second set of three RF coils into circular loops having a diameter of approximately three inches.

25. The method of claim 21 further comprising the step of connecting each of the first and second plurality of wires to a connector configured to be coupled with an MRI system.

26. A magnetic resonance (MR) coil apparatus comprising:

a first coil array having three coils placed in an overlapping pattern and configured to be positioned adjacent to an imaging patient such that a first region-of-interest (ROI) of the imaging patient is within a field-of-view (FOV) of the first coil array;

a second coil array having three coils placed in an overlapping pattern and configured to be positioned adjacent to the imaging patient such that a second ROI of the imaging patient is within an FOV of the second coil array;

a first former having the first coil array attached thereto and constructed to have a surface portion contoured to substantially match at least a first portion of a head and at least a first portion of a neck of the imaging patient;

a second former having the second coil array attached thereto and constructed to have a surface portion contoured to substantially match at least a second portion of the head and at least a second portion of the neck of the imaging patient;

a first pliable positioning device attached to the first former and constructed to allow positioning of the first former adjacent to the at least a first portion of the head and the at least a first portion of the neck of the imaging patient; and a second pliable positioning device attached to the second former and constructed to allow positioning of the second former adjacent to the at least a second portion of the head and the at least a second portion of the neck of the imaging patient.

27. The MR coil apparatus of claim 26 wherein at least one of the first and second pliable positioning devices is further defined as a ball-and-socket tube constructed to maintain a desired position of the former attached thereto.

28. The MR coil apparatus of claim 26 wherein the first and second pliable positioning devices are configured to be secured to a table of an MR scanner.

29. A magnetic resonance (MR) coil apparatus comprising:

a first surface coil array having three circular coils overlapping one another and configured to be positioned adjacent to an imaging patient such that a first region-of-interest (ROI) of the imaging patient is within a field-of-view (FOV) of the first coil array;

a second surface coil array having three circular coils overlapping one another and configured to be positioned adjacent to the imaging patient such that a second ROI of the imaging patient is within an FOV of the second coil array;

a first former having the first coil array attached thereto and constructed to have a surface portion contoured to substantially match at least a first portion of a head and at least a first portion of a neck of the imaging patient;

a second former having the second coil array attached thereto and constructed to have a surface portion contoured to substantially match at least a second portion of the head and at least a second portion of the neck of the imaging patient;

a first pliable positioning device attached to the first former and constructed to allow positioning of the first former adjacent to the at least a first portion of the head and the at least a first portion of the neck of the imaging patient; and a second pliable positioning device attached to the second former and constructed to allow positioning of the second former adjacent to the at least a second portion of the head and the at least a second portion of the neck of the imaging patient.

30. An MRI apparatus comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images, the RF coil assembly comprising:

a first former having three RF coils attached thereto and positionable adjacent to a first head portion and a first neck portion of a patient;

a second former having three RF coils attached thereto and positionable adjacent to a second head portion and a second neck portion of the patient; and wherein each RF coil has a cable trap balun connected thereto, and wherein the cable trap balun is further connected to a half-wavelength cable.

* * * * *

UNITED STATES PATENT AND TRADEMARK OFFICE
CERTIFICATE OF CORRECTION

PATENT NO. : 7,382,132 B1 Page 1 of 1
APPLICATION NO. : 10/908176
DATED : June 3, 2008
INVENTOR(S) : Mathew et al.

It is certified that error appears in the above-identified patent and that said Letters Patent is hereby corrected as shown below:

Col. 10, line 45 (Claim 16), delete "method" and
                substitute therefore -- MRI apparatus --;

Col. 10, line 52 (Claim 18), delete "method" and
                substitute therefore -- MRI apparatus --.

Signed and Sealed this

Twenty-sixth Day of August, 2008

JON W. DUDAS
*Director of the United States Patent and Trademark Office*